(12) United States Patent
Thony

(10) Patent No.: US 8,497,422 B2
(45) Date of Patent: Jul. 30, 2013

(54) FLAT LIGHT CONCENTRATION DEVICE WITH REDUCED THICKNESS

(75) Inventor: Philippe Thony, Entre-deux-Guiers (FR)

(73) Assignee: Commissariat a l'Energie Atomique, Paris (FR)

( * ) Notice: Subject to any disclaimer, the term of this patent is extended or adjusted under 35 U.S.C. 154(b) by 722 days.

(21) Appl. No.: 12/593,696

(22) PCT Filed: Mar. 31, 2008

(86) PCT No.: PCT/EP2008/053817
§ 371 (c)(1), (2), (4) Date: Sep. 29, 2009

(87) PCT Pub. No.: WO2008/125471
PCT Pub. Date: Oct. 23, 2008

(65) Prior Publication Data
US 2010/0037954 A1    Feb. 18, 2010

(30) Foreign Application Priority Data

Apr. 5, 2007   (FR) ..................... 07 54315

(51) Int. Cl.
| H01L 31/00 | (2006.01) |
| F24J 2/08 | (2006.01) |
| F24J 2/10 | (2006.01) |
| G02B 5/18 | (2006.01) |

(52) U.S. Cl.
USPC ............ 136/259; 136/246; 126/684; 359/572

(58) Field of Classification Search
USPC ............... 359/15, 572, 583, 13, 19, 619–638, 359/652–655, 726–736, 850–864; 136/246, 136/259; 126/624, 627, 683–701; 385/37, 385/129–132, 146
See application file for complete search history.

(56) References Cited

U.S. PATENT DOCUMENTS

| 4,863,224 A * | 9/1989 | Afian et al. ..................... 359/15 |
| 5,268,985 A | 12/1993 | Ando et al. |
| 5,877,874 A | 3/1999 | Rosenberg |
| 5,936,777 A | 8/1999 | Dempewolf |
| 6,265,653 B1 * | 7/2001 | Haigh et al. .................. 136/249 |
| 2003/0154973 A1 | 8/2003 | Nyhart et al. |

OTHER PUBLICATIONS

Falk, Brill & Stork, Seeing the Light: Optics in Nature, Photography, Color, Vision, and Holography,1986, pp. 54-57.*
A. Terao, et al., "New Developments on the Flat-Plate Micro-Concentrator Module", 3rd World Conference on Photovoltaic Energy Conversion, May 11-18, 2003, pp. 861-864.
J.C. Minano, et al., "Flat High Concentration Devices" First WCPEC, Dec. 5-9, 1994, pp. 1123-1126.

* cited by examiner

Primary Examiner — Stephone Allen
Assistant Examiner — Kimberly N Kakalec
(74) Attorney, Agent, or Firm — Oblon, Spivak, McClelland, Maier & Neustadt, L.L.P.

(57) ABSTRACT

A light concentration device includes: a plate including two principal faces and an edge between the two principal faces, a refractive index gradient existing between the two principal faces, and a diffraction grating functioning in reflection or semi-reflection that cooperates with one of the principal faces of the plate having the highest refractive index, the principal face having the lowest refractive index forming a front entry face for the light, at least one exit zone for the light being disposed on the edge.

19 Claims, 8 Drawing Sheets

FLAT LIGHT CONCENTRATION DEVICE WITH REDUCED THICKNESS

TECHNICAL FIELD

The present invention relates to a flat light concentration device with reduced thickness. Such a device can be associated with a photovoltaic cell or be used independently in the field of natural or artificial lighting. The use of a light concentration device in a photovoltaic device makes it possible to reduce the surface area of the photovoltaic cell for the same surface illuminated by the sun. It therefore reduces the cost of the energy produced.

PRIOR ART

Conventional light concentration devices, which are not intended to transform the solar spectrum, use Fresnel lenses or parabolic mirrors.

In both cases, these optical components are said to be primary and cooperate with secondary optical components also of the lens or mirror type. The focal distances of these devices are great. These devices are bulky and do not make it possible to obtain, when they are associated with a photovoltaic cell, an assembly with an acceptable thickness for a domestic application. In parabolic-mirror devices, the photovoltaic cell is placed at the focus of the parabolic mirror, which renders electrical contact and cooling of the cell difficult. The article "Flat high concentration devices", Minano J C et al, 24th Conference Photovoltaic Energy Conversion, Dec. 5-9, 1994, Hawaii, pages 1123 to 1126, describes such a light concentration device with parabolic mirror.

Other light concentration devices are integrated and mixed. They use dioptric surfaces, blocks of transparent material that can fulfil alternately the role of mirror or lens. The surfaces closest to the optical surface behave as lenses, the peripheral surfaces behave as mirrors, producing an internal light reflection. These mixed internal refraction and reflection devices have a shorter focal distance relative to their size. The solar cell that cooperates with such a device is placed downstream of the concentration device. Making contact and cooling are not interfered with. The concentration device is generally produced by injection moulding. It has significant variations in thickness in the zones and edges with acute angles that are not necessarily easy to achieve.

Moreover, the illumination received by the photovoltaic cell is not uniform and this is detrimental to the efficiency of the latter and its service life. Such integrated concentration devices are less bulky but this is achieved at the cost of increased complexity of the optical surfaces. The thickness of the complete device nevertheless remains several centimeters. The article "New developments on flat-plate micro-concentrator module", Terao, A et al, 3rd World Conference on Photovoltaic Energy Conversion, May 11-18, 2003 Osaka, Japan, pages 861-864, describe such an integrated light concentration device.

In addition, such light concentration devices have a very small acceptance angle, limited to approximately 1° to 3°. The acceptance angle corresponds to the limit value of the angle of incidence of the useful light rays on the front face of the light concentration device. Mechanical following of the sun can be provided in the application with a photovoltaic cell in order to capture the maximum amount of energy.

The smaller the acceptance angle, the greater must be the precision of the mechanical device and the more expensive this device is.

In these devices, the front face of the optical components must be protected and this protection is difficult or even impossible to achieve.

In the case of a plurality of optical components to be arranged in an array, a precise alignment of the components is required and the array has a complex entry surface.

Integration thereof in very large solar panels is difficult and these devices appear to be more suitable for use in centralised energy production, in solar farms, in which a plurality of solar panels of medium size are coupled.

It is also perceived that these light concentration devices have mediocre performance in diffuse lighting, in particular when the sky is cloudy, and can be used effectively only in very sunny areas.

DISCLOSURE OF THE INVENTION

The purpose of the present invention is precisely to propose a light concentration device that does not have the drawbacks mentioned above.

One aim of the invention is to propose a light concentration device of reduced thickness, typically less than a centimeter. In particular such a light concentration device has a thickness substantially equal to the width of the photovoltaic cell with which it can cooperate, a conventional solar cell has a thickness of between approximately 100 and 700 micrometers.

Another aim of the invention is to propose a light concentration device that is simple to produce and therefore inexpensive.

Yet another aim of the invention is to propose a light concentration device that has a large acceptance angle so as to be able to function without mechanical following of the sun.

An additional aim of the invention is to propose a light concentration device having acceptable performance even in diffuse lighting.

To achieve these aims, the light concentration device of the invention comprises at least one plate with an index gradient that cooperates with a diffraction grating.

More precisely, the present invention is a light concentration device that has a plate having two principal faces and an edge between the two principal faces, a refraction index gradient existing between the two principal faces, and a diffraction grating functioning in reflection or semi-reflection that cooperates with one of the principal faces of the plate, the one having the highest refraction index, the principal face having the lowest refraction index forming a front entry face for the light, at least one exit zone for the light being disposed on the edge.

The diffraction grating can comprise unidimensional or bidimensional patterns.

The unidimensional patterns can be substantially parallel lines.

The lines can be mouldings with a triangular, quadrangular, trapezoidal or rounded profile.

The bidimensional patterns can be cylindrically or conically shaped studs.

The diffraction grating can comprise several diffraction sub-gratings having patterns with different orientations.

The unidimensional patterns can have a direction that is parallel to one edge of a principal face of the plate, whereas the bidimensional patterns may have an axis of symmetry that is parallel to one edge of the principal face of the plate.

In a variant, the unidimensional patterns can have a direction that has an angle different from 0 and $\pi/2$ with respect to an edge of a principal face of the plate, the bidimensional patterns being able to have an axis of symmetry that has an angle different from 0 and $\pi/2$ with respect to an edge of the plate, this angle being equal in particular to approximately arctan(2), that is to say approximately 63°.

The edge is formed by several lateral faces of the plate, the exit zone can occupy an entire lateral face or only a portion.

A substantially constant refraction index, greater than or equal to the highest refraction index of the plate, is preferably given to the patterns of the diffraction grating.

In a variant, the patterns of the diffraction grating can have a refractive index gradient between a principal face that cooperates with the plate and another principal face opposite to the one that cooperates with the plate.

The light concentration device has a rear face that is a face of the diffraction grating situated opposite to the principal face having the lowest refractive index of the plate, the rear face can be provided with a reflective or semi-reflective rear coating. The efficiency of the light concentration device is thus increased.

The semi-reflective rear coating can be reflective for wavelengths outside the visible spectrum for humans and be transparent for wavelengths belonging to the visible spectrum. Thus the light concentration device allows light visible to human beings to pass.

Another plate with an index gradient, having two principal faces and an edge, and the plate with an index gradient can form a sandwich in which the diffraction grating is situated, the diffraction grating being on one side of the principal face having the highest refractive index and the other plate, the edge of the other plate being provided with at least one light exit zone.

The light concentration device has a rear face opposite to the principal face having the lowest refractive index of the plate or one of the plates, said rear face can be provided with a coloured rear coating intended to colour the light concentration device.

The coloured rear coating can be produced from silica, titanium oxide, magnesium fluoride or silicon nitride.

In another embodiment, the coloured rear coating can be formed from a naturally coloured material.

In a variant or in combination, the rear face can be provided with an external rear protective coating.

A front protection device can be placed against the main face having the lowest refractive index of the plate or at least one of the plates. It is thus possible to use plastics material for the plate even if this plastics material does not age well.

The principal face having the lowest refractive index of the plate or at least one of the plates can be provided with an anti-reflection coating, the principal face having the highest refractive index of the plate or at least one of the plates also being able to be provided with an anti-reflection coating.

The edge of the plate or of at least one of the plates can be provided with a lateral reflective coating, with the exception of the exit zone if it is opaque.

The diffraction grating and the plate or plates can be produced from glass or a plastics material allowing light to pass, such as a polymer chosen from polystyrene, polymethyl methacrylate or polycarbonate.

The plastics material can be loaded with nanoparticles based on silicon, titanium oxide, lead sulphide or an II-VI or III-V alloy in order to increase its refractive index.

The diffracting grating and the plate or plates may be flexible.

The present invention also concerns a photovoltaic device comprising a light concentration device thus characterised and a photovoltaic cell mounted on each exit zone.

The photovoltaic cell has a useful zone having dimensions that are substantially those of the exit zone on which it is mounted.

The present invention also concerns a method of producing a light concentration device in which a plate having two principal faces and an edge and having a refractive index increasing between the two principal faces and a diffraction grating functioning in reflection or semi-reflection, are made to cooperate, the diffraction grating being situated on the side of the principal face having the highest refractive index of the plate, and at least one exit zone for the light is defined on the edge of the plate.

The diffraction grating can be formed within the plate by lithography, dry or wet etching, mechanical tracing, laser ablation or embossing.

In a variant, the diffraction grating can be produced by embossing in a layer formed on the plate.

In a variant, the diffraction grating can be attached to the plate. In this configuration, the diffraction grating can be produced by moulding, by embossing, by lithogravure techniques or by holography.

A reflective or semi-reflective rear coating can be formed on a rear face of the light concentration device, situated opposite to the face having the lowest refractive index of the plate, this rear face being one face of the diffraction grating.

The diffraction grating can be sandwiched between the plate with an index gradient and another plate with an index gradient, this other plate having two principal faces and an edge, the diffraction grating being on the side of the principal face having the highest refractive index of the other plate, and define at least one exit zone for the light on the edge of the other plate.

The other plate can be attached to an assembly formed by the plate and the diffraction grating.

In a variant, the plate and the other plate can be assembled and form the diffraction grating in the region of the interface between the two plates.

The plate or at least one of the plates is monolithic.

In a variant, it is possible to form the plate or at least one of the plates by assembling a plurality of strips so as to obtain a stack, these strips having different refractive indices, and then by heating the stack until fusion so as to eliminate the interfaces between the strips by interdiffusion.

The light concentration device has a front face that is the principal face having the lowest diffractive index of the plate or of at least one of the plates, and according to the method the front protection device can be disposed on the front face.

The light concentration device has a rear face opposite to the principal face having the lowest refractive index of the plate or of one of the plates. According to the method, it is possible to form an external rear protective coating on the rear face.

In a variant or in combination, it is possible to form a coloured coating on the rear face, this coating having one or more superimposed layers.

In a variant, it is possible to form an anti-reflection coating on the principal face having the lowest refractive index of the plate or at least one of the plates and possibly on the principal face having the highest refractive index of the plate or at least one of the plates.

It is possible to form a lateral reflective coating on the edge of the plate or at least one of the plates with the exception of the exit zone if it is opaque.

The present invention also concerns a method of producing a photovoltaic device in which a light concentration device is produced by the method thus characterised, and a photovoltaic cell is mounted facing each light exit zone of the light concentration device.

BRIEF DESCRIPTION OF THE DRAWINGS

The present invention will be better understood from a reading of the description of example embodiments given, purely for indication and in no way limitatively, with reference to the accompanying drawings, in which.

The different variants described must be understood as not being exclusive of one another.

Identical, similar or equivalent parts of the various figures described below bear the same numerical reference signs so as to facilitate passage from one figure to another.

The various parts shown in the figures are not necessarily shown according to a uniform scale, in order to make the figures more legible.

DETAILED DISCLOSURE OF PARTICULAR EMBODIMENTS

Figure 1A:
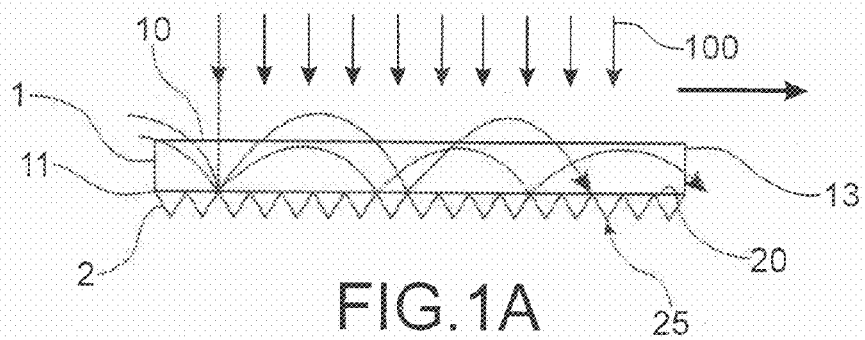
FIGS. 1A, 1B show, in section, a first example of a light concentration device according to the invention.

A description will now be given, with reference to FIG. 1A, of a first example of a light concentration device according to the invention. This light concentration device comprises at least one plate 1 with a refractive index gradient and at least one diffraction grating 2. The diffraction grating 2 is reflective or semi-reflective.

Plate means a sheet allowing light to pass, having two substantially flat parallel principal faces 10, 11 and an edge 13. The face referenced 10 is said to be the front face of the light concentration device. The plate with a refractive index gradient 1 and the diffraction grating 2 are up against each other. The other principal face 11 of the plate 1 and a principal face 20 of the diffraction grating 2 form an interface between the diffraction grating 2 and the plate 1. The other face 25 of the refraction grating forms the rear face of the light concentration device.

The refractive index of the plate 1 increases along the thickness of the plate 1, from the front face 10 towards the other face 11. Light rays 100, intercepted by the front face 10, which pass through the thickness of the plate 1 with a normal incidence, have been shown. They arrive on the diffraction grating 2, which is assumed, in this example, to have a substantially constant refractive index greater than or equal to the highest index of the plate 1. The diffraction grating 2 diffracts the light rays 100 that have passed through the plate 1 in several orders of diffraction. The diffracted light rays are reflected towards the plate 1 with an angular offset imposed by the pitch of the diffraction grating 2. When they once again enter the plate 1, the rays 100 curve because of the gradient of the refractive index. Some of them are once again reflected by the diffraction grating 2. They leave the light concentration device, having, in some cases, undergone several reflections, by at least one exit zone 12 disposed on the edge 13 of the plate 1.

The diffraction grating 2 has patterns 4 that may be unidimensional or bidimensional. If they are unidimensional, they are referred to hereinafter as lines, these are mouldings 4 whose profile may be triangular, quadrangular, trapezoidal, rounded or the like. Two adjacent mouldings 4 are separated by a space 5. The space 5 is not visible in FIG. 1A, the patterns 4 being contiguous, but on the other hand it can be seen in FIGS. 2, 3A. The space 5 can be solid or empty of solid material. It may take the form of a trench.

Figure 1B:
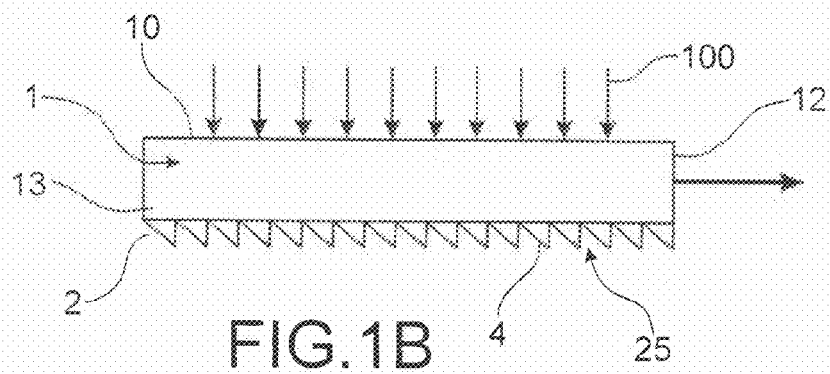

If it is a case of lines with a triangular profile, the triangle may be isosceles, right angled or any. A triangular profile improves the diffraction efficiency in a given order for a given spectral range. A profile in a right-angled triangle as illustrated in FIG. 1B enables the light to be concentrated in a single direction and to leave the concentration device at a single exit zone 12.

Figure 3A:
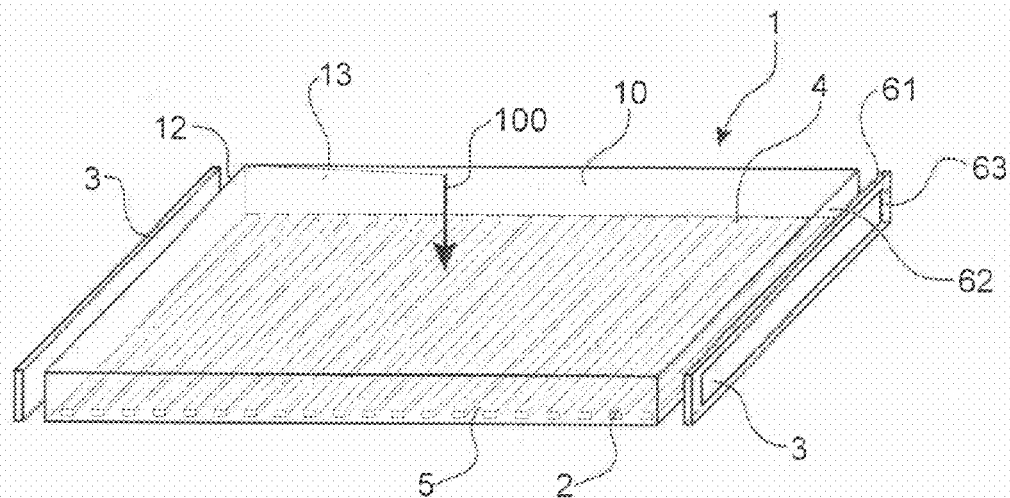
FIGS. 3A, 3B show photovoltaic devices according to the invention incorporating a light concentration device according to the invention.

The lines 4 are substantially parallel and can be directed along one edge of a principal face of the plate 1 as illustrated in FIG. 3A.

It is possible to put several diffraction sub-gratings 24 on the plate 1 in order to form one of them. If it is a case of diffraction sub-gratings 24 with lines 4, the lines of the different sub-gratings 24 can have different directions as illustrated in FIG. 2.

Figure 2:
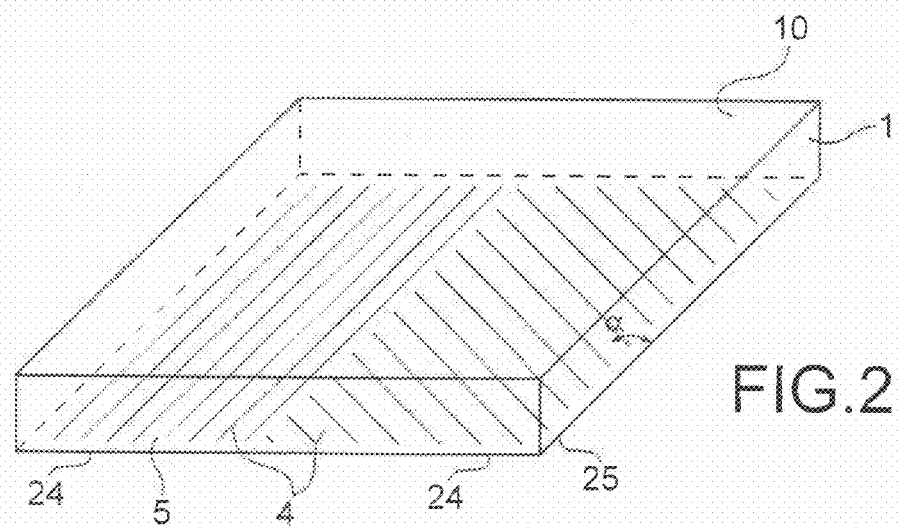
FIG. 2 shows an example of a light concentration device according to the invention in which the diffraction grating is formed by several diffraction sub-gratings.

The lines 4 of a diffraction grating 2 can have an angle α different from 0 and π/2 with respect to an edge of a principal face of the plate 1 as illustrated in FIG. 2. For example, the angle α is equal to substantially π/4.

Figure 3B:
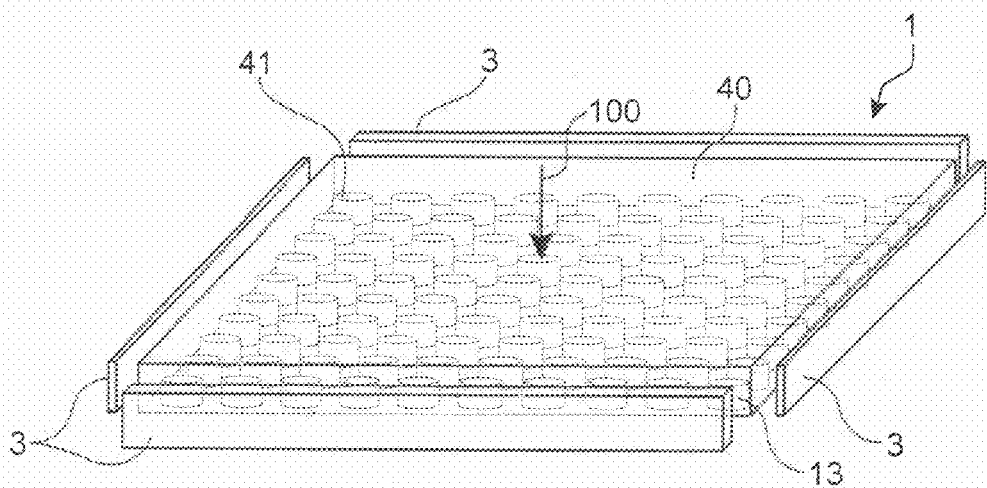

It is also possible for the patterns 4, 40 of the diffraction grating 2 not to be unidimensional but to be bidimensional as illustrated in FIG. 3B. The two FIGS. 3A and 3B are not to the same scale and the scale of the patterns 40 does not correspond to that of the plate 1 in order to facilitate understanding. In FIG. 3B, the diffraction grating comprises a plurality of patterns 40 that are studs regularly distributed in lines and columns. FIG. 3B shows a perspective view of the studs 40. The studs 40 are for example, as illustrated, cylindrical studs with a circular base. They could have a square, triangular or other base. It is even possible to envisage that they are cones, possibly truncated.

FIG. 3A shows in three dimensions a light concentration device according to the invention associated with at least two photovoltaic cells 3, which leads to a photovoltaic device according to the invention.

Two photovoltaic cells 3 have been shown, each of them is secured to an exit zone 12. These photovoltaic cells 3 have a sensitive surface substantially identical to the surfaces of the exit zones 12 that face them, here it is a question of the faces of the edge 13 of the plate 1. The total surface of the photovoltaic cells 3 corresponds to what will be referred to hereinafter as the useful surface of the photovoltaic device.

It can be seen perfectly in this FIG. 3A that the thickness of the light concentration device 1 does not exceed the width of the photovoltaic cells 3.

If the photovoltaic cells 3 have to be cooled, it can be seen that this is not a problem, a cooling device 63, shown diagrammatically in dotted lines, can easily be mounted on the rear face 62 of the cell, this rear face 62 being opposite to the one referenced 61 that faces the light concentration device. This rear face is perfectly accessible. The photovoltaic cells 3 are substantially parallel to the lines 4 of the diffraction grating 2 or to an axis of symmetry of the studs 40. In FIG. 3B, each of the faces of the edge 13 of the plate 1 cooperates with a photovoltaic cell 3, since the studs 40 have two axes of symmetry.

The patterns 4, 40 of the diffraction gratings 2 can be produced from glass or plastics material, for example polystyrene, polymethyl methacrylate PMMA, polycarbonate or other polymers allowing light to pass. The diffraction grating 2 has an index contrast between its patterns 4, 40 and the space 5 that separates them. The refractive index of the patterns 4, 40, in so far as it is constant, is generally greater than or equal to the highest refractive index of the plate 1. In order to increase and control the refractive index of the patterns 4, 40 of the diffraction grating 2, in particular when they are made from plastics material, it is possible to load the plastics material with nanoparticles 30, the nanoparticles 30 being able to be produced from silicon, titanium oxide, lead sulphide or II-VI or III-V alloys. The II-VI alloys are compounds comprising elements in columns II and VI in the periodic table of elements, among which there is at least one metal or a metalloid.

The plate 1 can be produced from glass or plastics material, such as for example polystyrene, polymethyl methacrylate PMMA, polycarbonate or other polymers allowing light to pass. The plate 1 can be loaded with nanoparticles 30, the concentration and size of the nanoparticles depend locally on the refractive index required and this incorporation of the nanoparticles 30 makes it possible to produce the refractive index gradient as illustrated in FIG. 8.

Figure 9A:
FIGS. 9A to 9D show other steps of the method of producing a light concentration device according to the invention and producing a photovoltaic device incorporating the light concentration device.
Figure 9B:
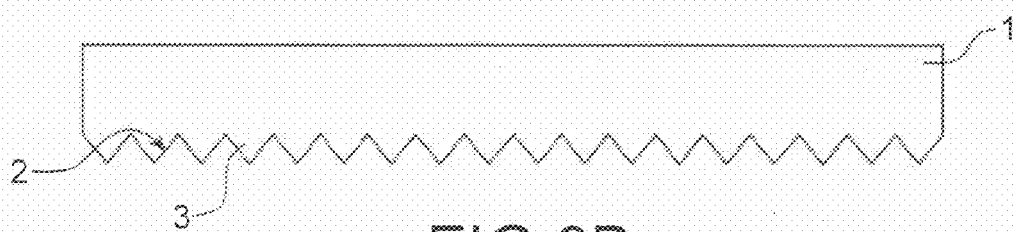
Figure 9C:
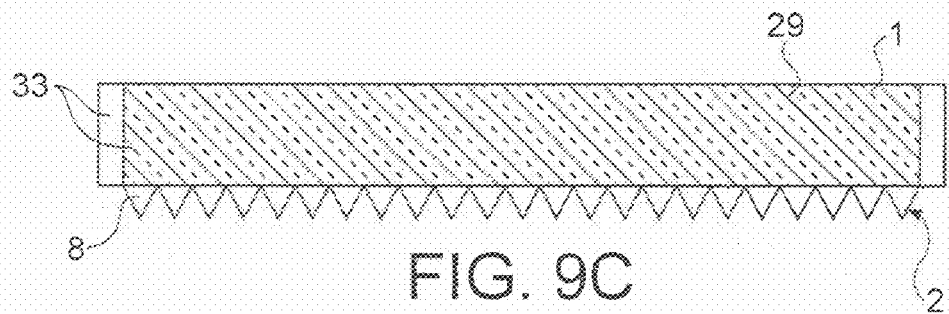
Figure 9D:
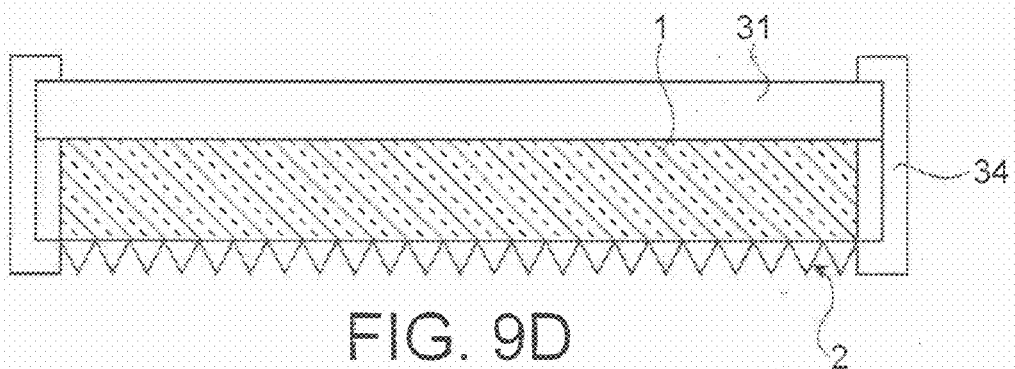

For use outside, in particular in the case of an application in a photovoltaic device, it is preferable to provide a front protection device 31 up against the front face 10 of the plate 1 as illustrated in FIG. 9D. Organic materials age when they are exposed to the sun and weather. They are in general less stable than inorganic materials. This front protection device 31 can thus serve to prevent damage such as shocks or impacts. This front protection device 31 can be produced by a coating deposited on a sheet connected to the plate 1. This front protection device 31 can also have a mechanical support role. This front protection device 31 can be produced by a glass pane, which is the standard solution. It will be chosen so as to be sufficiently transparent and strong. Some plastics materials could also be used, such as polymethyl methacrylate, with however a shorter service life. A frame 34 is also provided, for example made from aluminium, which holds the assembly at the periphery.

Figure 4A:
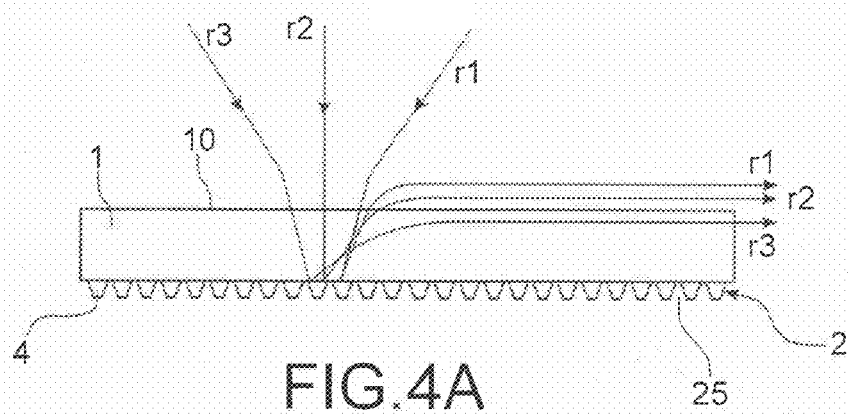
FIGS. 4A, 4B, 4C, 4D show yet other examples of light concentration devices according to the invention.
Figure 4B:
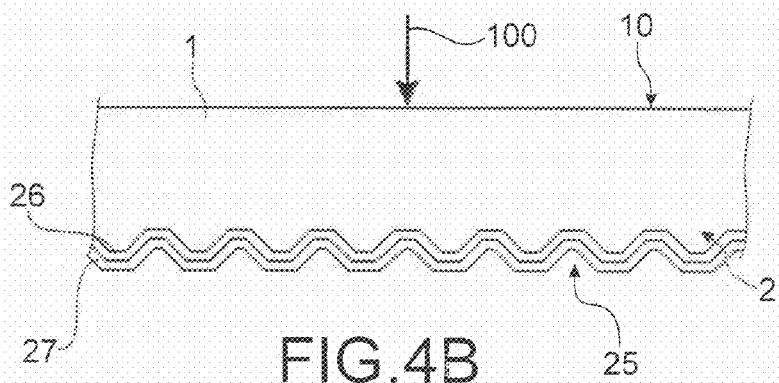
Figure 4C:
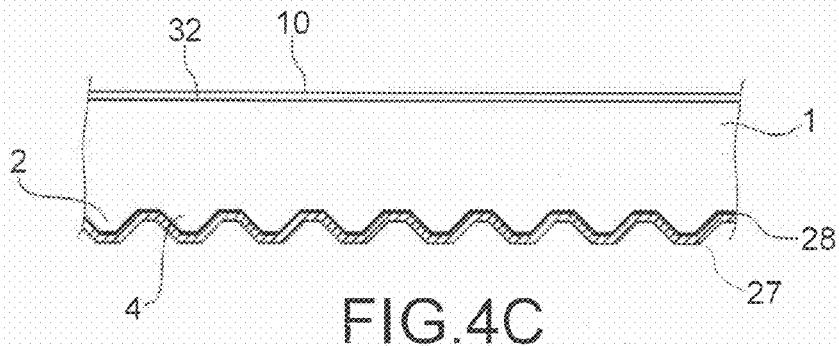
Figure 4D:
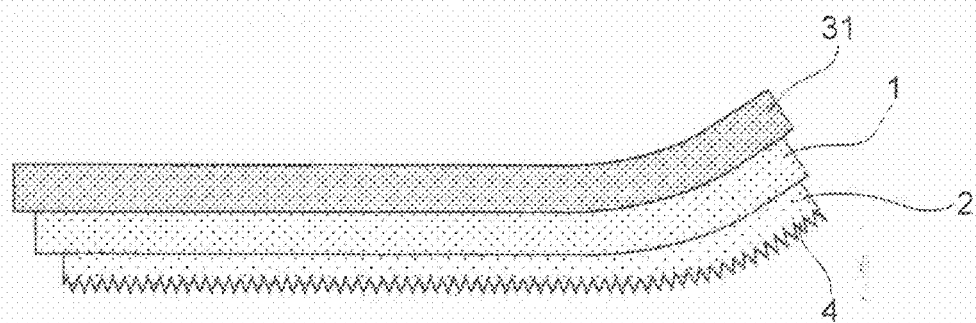

In a variant, as illustrated in FIG. 4D, it is possible for the light concentration device to be flexible. Thus it can fit on any support. At the same time, the front protection device 31, the plate 1 (or plates if there are several of them) and the diffraction grating 2 are produced from a flexible plastics material of the polymer type.

The form of the plate and diffraction device and the materials that make them up are adapted so as to promote optimum integration of the light concentration device in a particular system.

The thickness of the plate 1 can be between approximately 0.5 and 20 millimeters. The patterns 4, 40 can have a height and width of between approximately 0.1 and 10 micrometers. The total thickness of the light concentration device will then be between approximately 1.5 and 50 millimeters. This range of thicknesses leads to thicknesses much less than those of light concentration devices of the prior art. Its surface can be between approximately 25 cm² and 1 m².

In order to obtain the required index gradient, the plate 1 can be formed from a stack of strips 1.1, each having a constant refractive index, as will be seen subsequently in FIG. 8D.

The refractive index gradient of the plate 1 will be greater than 0.05. In fact, the higher the refractive index gradient, the higher the angular and spectral acceptance obtained. Rays inclined with angles of at least 50° can be collected as illustrated in FIG. 4A. It should however be noted that the concentration factor, that is to say the ratio between the energy that emerges from the light concentration device and the energy that enters therein depends on the angular acceptance and the wavelength of the radiation. In FIG. 4A, the lines 4 have a quadrangular profile substantially in a trapezium.

Possible dimensions for the light concentration device shown in FIG. 3A will now be given.

Dimensions of the plate: 150 mm×150 mm
Thickness of the plate: 2 mm
Index gradient: 0.29
Diffraction grating pitch 0.5 micrometers
Angle at the vertex of a line: 120°

In FIG. 4A, three light rays referenced r1, r2, r3 are shown, they each have a different incidence with respect to the front face 10 of the plate 1. Their paths in the light concentration device are traced and they can be seen emerging from the latter. At the exit, they are parallel and collected together. With such a light concentration device, it is possible to collect light energy under meteorological conditions under which the sky is diffuse. It is no longer necessary to provide a mechanical device for following the sun and this leads to a much lower cost than previously. It is assumed that in FIG. 4A the light rays r1, r2, r3 all have the same wavelength.

In order to increase the efficiency of the light concentration device of the invention, it is possible to make its rear face 25 reflective, which corresponds to the face of the diffraction grating 2 opposite to the plate 1. It can for example be covered with a rear reflective coating 26, for example based on aluminium or silver. It is possible to line this rear reflective coating 26 externally with an external rear protective coating 27, which may for example be made from silica. This rear reflective coating 26 reflects light rays 100 that have passed through the plate 1 and arrive as far as the rear face 25. The rear reflective coating 26 and the external rear protective coating 27 are visible in FIG. 4B.

In a variant, in some applications, it may be wished for the light concentration device to remain translucent for a human being while having improved efficiency. It should be noted that the diffraction grating 2 can possible colour or deform the image and therefore that it is not possible to see through a faithful image. However, the light concentration device can be used as a light well, for example if it is placed on the roof of a building. For this purpose, it will be possible to coat the rear face 25 of the light concentration device with a semi-reflective coating, that is to say one that is transparent in the range of the solar spectrum that is visible to humans and is reflective outside the visible spectrum. For example, it can be specified that the coating has a transparency greater than approximately 90% between 400 and 700 nanometers and a transparency of approximately 0% between 250 and 400 nanometers and between 700 and 1100 nanometers. The two delimiters 400 and 700 nanometers are excluded in one of the three ranges. These wavelengths are of course to be adapted according to the solar cells employed and the chosen application. The zero order of the diffraction grating 2 makes it possible to see what is happening on the side of the rear face 25, with however strong chromatics. In this variant also, the external rear protective coating 27 can be provided. In order not to increase the number of figures, it is assumed that the coating 26 in FIG. 4B represents the rear reflective coating or the rear semi-reflective coating.

It is possible to provide for the light concentration device to be coloured, in particular if it is used in a building and it is wished for it to merge into its surroundings. It is thus possible to modulate its transparency or the saturation of the colour. A rear coloured coating 28 of the rear face 25 of the light concentration device is shown in FIG. 4C. It can be formed by a material coloured by nature, such as a polymer including pigments or phosphors or a paint. It can also be formed by a stack of one or more dielectric layers based for example on silica, titanium oxide, magnesium fluoride or any other material used in a thin layer in optics for colouring. The number of layers can be for example between one and four for example. It is possible to add the coloured coating 28 to the reflective coating 26 and/or the protective coating 27. In addition, in FIG. 4C, the front face 10 of the light concentration device has been coated, on the side of the face 10 having the lowest refractive index of the plate 1, with an anti-reflection coating 32. This also helps to improve the efficiency of collection.

Figure 6:
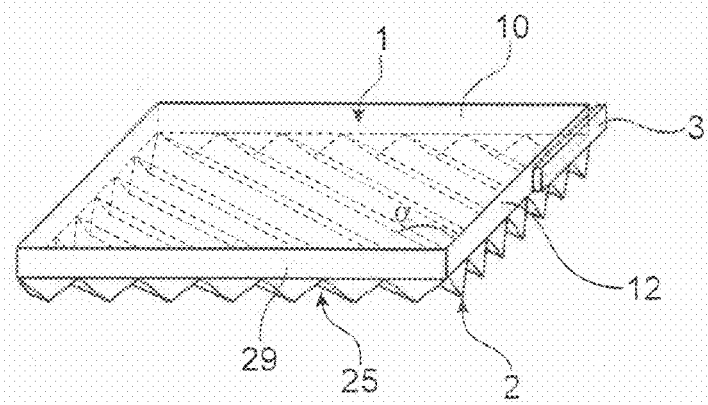
FIG. 6 shows in three dimensions yet another example of a light concentration device according to the invention with improved efficiency.

For the purpose of reducing the surface area of the exit zone 12 of the light concentration device and therefore, in the case of an application in a photovoltaic device, reducing its useful surface, it is possible to orient the patterns 4, 40 of the diffraction grating so that they have an angle α with the exit zones 12 of the light concentration device. Reference is made to FIG. 6. With an angle of arctan(2), that is to say approximately 63°, or arctan(1/2), the surface area of the exit zone 12 is reduced by half.

More generally, the surface area is reduced by N if the angle is arctan(N) or arctan(1/N).

The smaller the surface of an exit zone 12, the higher the reflection number on the edge 13 and the greater the risk of losses being high during reflections on the edge 13.

In addition, the edge 13 of the plate 1 is coated with a lateral reflective coating 29, with the exception of the exit zone 12 if it is opaque. If it is transparent, it can be put everywhere. If the exit zone 12 occupies an entire face of the edge 13, this lateral reflective coating 29 is not put on this face. This lateral reflective coating 29 reflects light rays propagating within the plate 1. The better the quality of the lateral reflective coating 29, the lower will be the losses due to reflection. In FIG. 6, such a lateral reflective coating 29 has been shown, which completely covers three of the faces of the edge 13 of the blade and half of the last face of the edge 13. There is only a single photovoltaic cell 3 that occupies only a portion of a lateral face of the edge 13 of the plate 1. The useful surface of the photovoltaic device has been reduced by a factor of four for the same quantity of energy collected.

It is possible to provide an external lateral protective coating, referenced 33 in FIG. 9C, on the edge 13, it also covers the photovoltaic cells 3. It can be formed by the frame 34 mentioned above.

For the purpose of improving the efficiency of the light concentration device of the invention, it is preferable to provide at least one of the principal faces 10, 11 of the plate 1 with an anti-reflection coating. This anti-reflection coating 32 has already been mentioned and will be described later in the description.

Reference will now be made to FIGS. 7A to 7E, which show non-limitative examples of forms of plates 1 of the light concentration device of the invention. Axes of symmetry 22' of the patterns of the diffraction network and one or two photovoltaic cells 3 per device have also been shown schematically. When the patterns are lines, the latter are practically merged with the axis of symmetry.

Figure 7A:
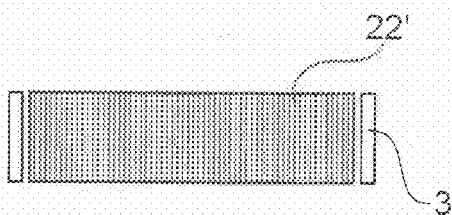
FIGS. 7A to 7E show various forms of photovoltaic devices according to the invention.

In FIG. 7A, the plate 1 is a quadrilateral, or more precisely a rectangle, the axes of symmetry 22' of the patterns of the diffraction grating are parallel to the width of the plate 1, two photovoltaic cells 3 are shown, each is placed along an edge corresponding to the width of the plate. Their length is that of the edge.

Figure 7B:
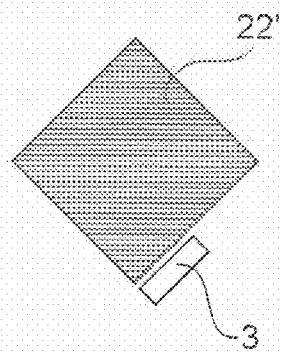

In FIG. 7B, the plate 1 is a quadrilateral, or more precisely a square, the axes of symmetry 22' of the patterns of the diffraction grating are parallel to a diagonal of the square, only one photovoltaic cell 3 is shown, it is placed along one of the sides of the square, but its length is less than that of the side, it corresponds substantially to half of the side.

Figure 7C:
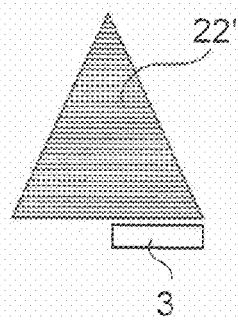

In FIG. 7C, the plate 1 is triangular, the axes of symmetry 22' of the patterns of the diffraction grating follow one side of the triangle, a photovoltaic cell 3 is placed along this side and its length is less than that of the side, it corresponds substantially to half of the side.

Figure 7D:
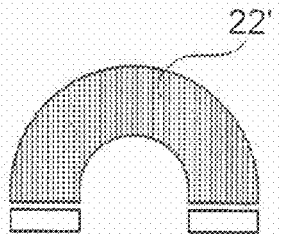

In FIG. 7D, the plate 1 is in the form of a half-ring. The axes of symmetry 22' of the patterns of the diffraction grating are parallel to the axis of symmetry of the half-ring. There are two photovoltaic cells 3 each placed along an end edge of the half-ring.

Figure 7E:
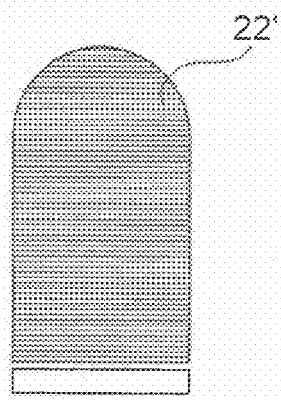

FIG. 7E shows the plate 1 in the form of a quadrilateral, or more precisely a rectangle, which is extended by a semicircle, the diameter of which corresponds to one side of the quadrilateral. The axes of symmetry 22' of the patterns of the diffraction grating are parallel to a side of the quadrilateral opposite to the one up against the semicircle. A photovoltaic cell 3 is shown, placed along the side opposite to the one that is adjacent to the semicircle.

Figure 5A:
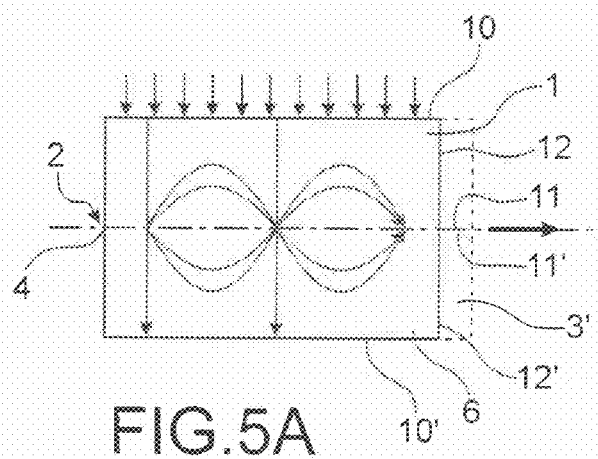
FIGS. 5A, 5B show examples of light concentration devices with a double index gradient according to the invention.
Figure 5B:
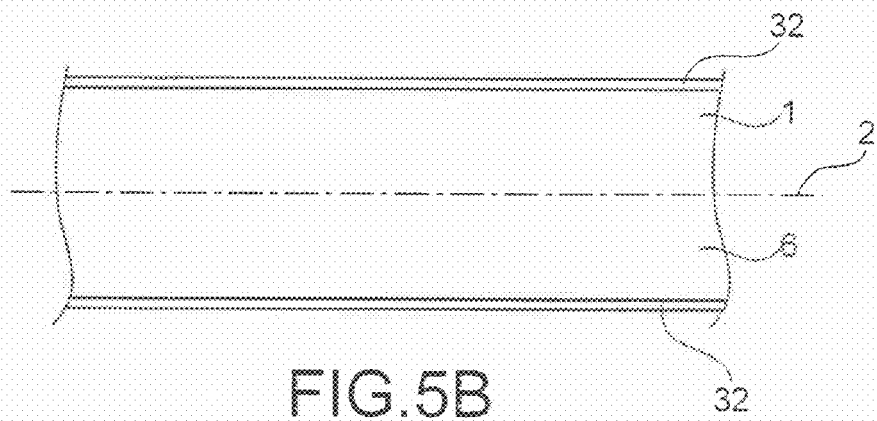

Another configuration of a light concentration device according to the invention will now be dealt with. Reference is made to FIGS. 5A and 5B.

Now the light concentration device comprises two plates 1 and 6 with a refractive index gradient sandwiching the diffraction grating 2. The first plate 1 comprises a principal face 11 with a high refractive index up against the diffraction grating 2 and another principal face 10 with a lower refractive index. A second plate 6 also comprises a principal face 11' with a high refractive index up against the diffraction grating 2 and another principal face 10' with a lower refractive index. When the other principal face 10 of the first plate 1 forms a front face of the light concentration device, the other principal face 10' of the second plate 6 forms the rear face of the light concentration device. The converse is possible, the front face can be situated level with the second plate 6 and the rear face level with the first plate 1. In the two plates 1, 6, the highest refractive index is situated on the same side as the side of the diffraction grating 2. Such a diffraction grating 2 can then function both in reflection and in transmission. In addition to what has been described in FIG. 1A, light rays 100 that enter the first plate 1 through the front face 10 and that are diffracted by the diffraction grating 2, enter the second plate 6. These rays 100 curve because of the gradient of the refractive index. Some of them are once again reflected by the diffraction grating 2. They emerge from the light concentration device having in some cases undergone several reflections, by at least one exit zone 12 disposed on the edge 13 of the first plate 1 and/or on an exit zone 12' disposed on the edge of the second plate 6. In this way a true light waveguide is formed that brings the light to at least one end of the light concentration device while being diffracted by the diffraction grating and propagating in the plates. Light that has passed through the first plate 1 and is not diffracted by the diffraction grating 2, that is to say corresponding to the zero order, passes through the second plate 6, and is transmitted by the diffraction grating 2. It is then possible to see a correct image of what is happening on the side of the second diffraction plate, when the light concentration device is looked at from the first plate.

The refractive index gradients of the two plates 1, 6 can be the same or different.

In this configuration, no reflective coating is provided on the rear face of the light concentration device. On the other hand, it is preferable to provide an anti-reflection coating on the two free principal faces 10, 10' of the two plates 1, 6 with an index gradient. This anti-reflection coating is referenced respectively 32, 32' in FIG. 5B.

The rear coloured coating, the external rear protective coating and the front protection device can be situated on the second plate 6, in a configuration with two plates, just like the anti-reflection coating. Some of these coatings have not been drawn in this configuration in order not to unnecessarily increase the number of figures. Reference can be made to FIG. 5B, which shows a coating 32' on the second plate 6.

A photovoltaic cell associated with the light concentration device has been sketched in FIG. 5A. It is referenced 3' and is situated facing the exit zone 12 on the first plate 1 and also facing the exit zone 12' of the second plate 6. Naturally two adjacent cells could be used.

Advantages of the light concentrating device of the invention will now be enumerated. It is compact, in particular in terms of thickness, it can take a wide variety of forms, and this form can be adapted to a support that is intended to receive it. A roof tile can for example be thought of, or a frame having to delimit a light well or another element of a building such as a shutter. Its transparency can be chosen within a wide range. It is of interest in particular in the light well application. The variant in FIG. 5 is particularly suitable when a transparent light concentration device is sought. Its colour can be chosen within a wide range, and this is advantageous in particular in a dwelling for integrating it in an environment with a given colour. Since it can function without a mechanical sun-following device, it is easier to integrate into any system. The light concentration device has increased performance in the case of diffuse lighting.

In the application in a photovoltaic device, the quantity of semiconductor material used can be reduced since the useful surface can be reduced. The energy production cost can be reduced since the mechanical sun-following device can be dispensed with. Moreover, the light concentration device of the invention, because of the multiple reflections, makes it possible to distribute the lighting over the whole of the photovoltaic cell, thus improving its service life.

An example of a method of manufacturing such a light concentration device and a photovoltaic device will now be described.

Figure 8A:
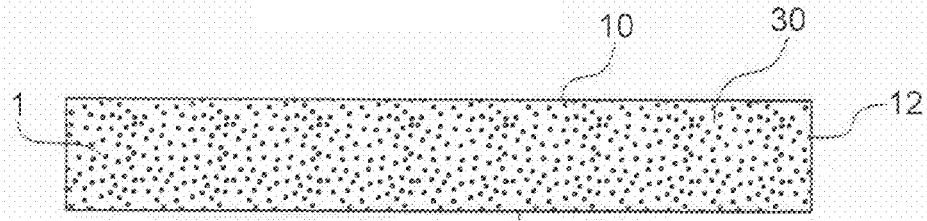
FIGS. 8A to 8D show several steps of a method of producing a light concentration device according to the invention and a photovoltaic device incorporating the light concentration device.
Figure 8B:
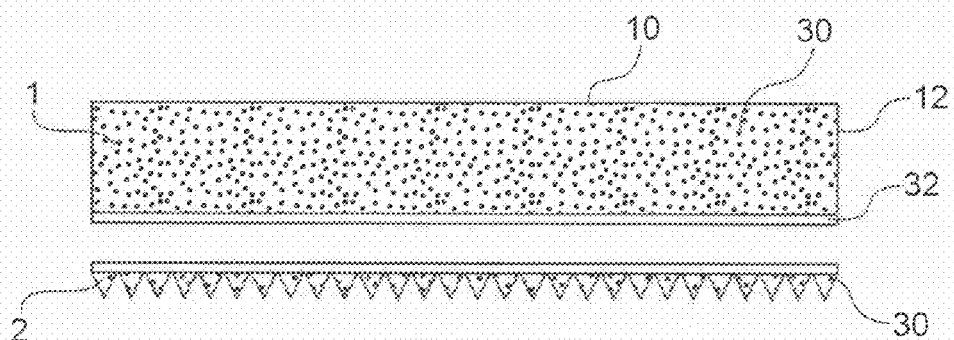

The starting point is a plate 1 with a refractive index gradient, the gradient increasing along its thickness (FIG. 8A). It has two principal faces 10, 11 and an edge 13. It is made to cooperate with a diffraction grating 2 placed at its principal face 11 having the highest refractive index (FIG. 8B). In order to obtain a photovoltaic device, at least one photovoltaic cell 3 is mounted at an exit zone 12 of the light concentration device that is situated on the edge of the plate 1, for example by adhesive bonding (FIG. 8C).

Figure 8C:
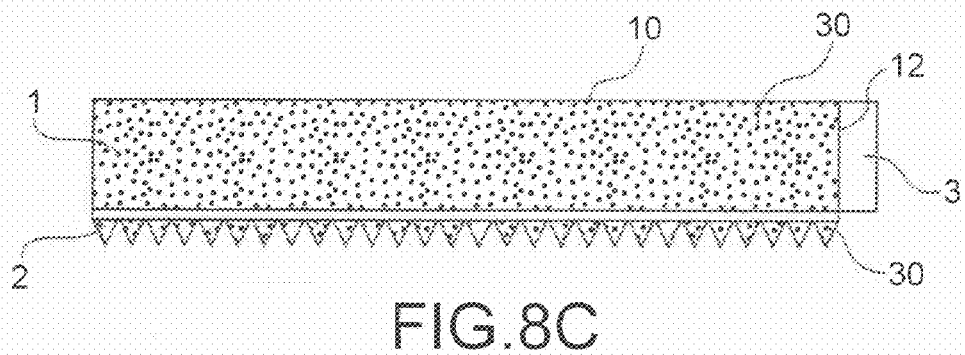

In FIGS. 8B and 8C, it is assumed that nanoparticles 30 are incorporated in the patterns 3 of the diffraction grating 2 and the plate 1 in order to achieve the required refractive index and variation.

Figure 8D:
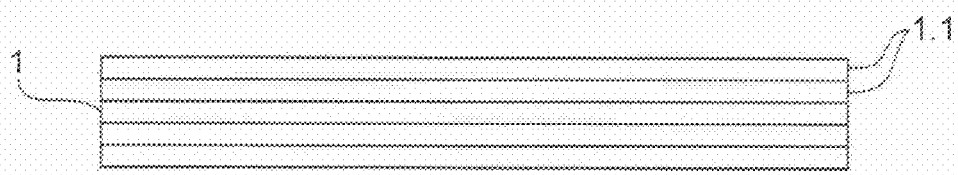

The plate with index gradient 1 may be monolithic (as in FIG. 8A) or be formed by a stack of strips 1.1 having different refractive indices (FIG. 8D). These strips 1.1 are assembled together for example by adhesive bonding with an adhesive (known by the English term "glass fuser glue") or by molecular assembly without adhesive. Next a step of fusion and elimination of the interfaces between the strips 1.1 by interdiffusion is provided, if adhesive has been used or if there has been molecular assembly.

Cooperation between the plate 1 and the diffraction grating 2 can take place by transfer of the diffraction grating 2 onto the principal face 11 of the plate 1 with a high refractive index, as illustrated in FIG. 9A.

The diffracting grating 2 can be manufactured by moulding, embossing or lithogravure techniques or by holography.

The diffraction grating 2 can be transferred individually, or collectively by adhesive bonding on a large plate and the assembly will then be subdivided into several pieces. The adhesive is referenced 7 in FIG. 9A.

In a variant, the diffraction grating 2 can be formed in the plate 1 with an index gradient, on the side with the high refractive index of the plate 1, by etching, for example by dry or wet etching after lithography, by mechanical tracing as illustrated in FIG. 9B or even by laser ablation or even embossing. It can even be envisaged producing the diffraction grating 2 on the plate 1 by a step of embossing a layer of polymer 8 previously deposited on the plate 1, on the high refractive index side, as illustrated in FIG. 9C. The layer of polymer 8 is seen only after the embossing.

In the configuration in FIG. 9B, the patterns 3 of the diffraction grating 2 have a refractive index gradient and in addition a constant refractive index.

Provision can be made for forming a lateral reflective coating 29 on at least part of the edge 13 of the plate 1. This lateral reflective coating 29 can be done based on aluminium or silver. This lateral reflective coating 29 can be obtained by spraying or evaporation and be produced before or after the fixing of the diffraction grating 2 to the plate or before or after the production of the diffraction grating 2 on or within the plate 1.

The part provided with the lateral reflective coating 29 can correspond to the entire edge 13 of the plate 1 if the coating is transparent, if it is opaque at least one exit zone 12 that will face the photovoltaic cell 3 is saved. This lateral reflective coating 29 is represented in FIG. 9A by hatching in dotted lines. It is also possible to add to the lateral reflective coating 29 an external lateral protective coating 33. This external protective coating 33 can be produced for example from silica and obtained by spraying or from polymer and obtained by dipping or liquid deposition. The protective coating 33 can be global and protect the entire light concentration device.

Provision can be made for forming, for example by spraying or sol-gel deposition, a rear reflective or semi-reflective coating 26 on the rear face 25 of the light concentration device. This rear reflective or semi-reflective coating 26 may be present on the diffraction grating 2 before connecting it to the plate 1 or be produced afterwards. When the diffraction grading 2 is formed on or within the plate 1, the rear reflective or semi-reflective coating 26 will be produced after formation of the diffraction grating 2. The rear reflective coating 26 can be produced from aluminium or silver for example. The rear semi-reflective coating 26 can be produced for example from silica, silicon nitride, titanium oxide, magnesium fluoride or tantalum oxide. This rear reflective or semi-reflective coating 26 is visible in FIG. 4B.

Provision can be made for forming a rear coloured coating 28 on the rear face 25 of the light concentration device. This rear coloured coating 28 can be present on the diffraction grating 2 before connecting it to the plate 1 or be produced after the production of the diffraction grating on or within the plate 1. This coloured coating 28 is visible in FIG. 4C. It can be produced for example by spraying, sol-gel deposition, spin deposition or dipping and be formed by one or more layers of materials, which may be transparent by nature or on the contrary naturally coloured such as paints or materials including rare-earth ions or phosphors or fluorescent particles. These materials can for example be chosen from silica, titanium oxide, magnesium fluoride or any other known dielectric material for contributing a colour. Stacking the various materials with various thicknesses and according to various sequences will lead to a given interferential colour.

Provision can also be made for the coloured coating 28 to comprise at least one layer of neutral material such as silica or a polymer of the PMMA type incorporating luminophore grains.

The rear coloured coating 28 can be associated with the external rear protective coating 27.

Provision can be made for producing an anti-reflection coating 32 on at least one of the principal faces 10, 11 of the plate 1, and, if there is only one of them, it is put on the front face 10 of the plate 1, on the low refractive index side. This is in particular the case if the diffraction grating is formed within the plate 1.

When the diffraction grating 2 is transferred onto the plate 1 or formed on the plate 1, the other principal face 11 can also be provided with the plate 1 that will receive the diffraction grating 2 of the anti-reflection coating 32 before the transfer or formation of the diffraction grating as illustrated in FIG. 8B. This anti-reflection coating 32 can be single layer or multi-layer.

The anti-reflection coating 32 can be produced from a stack of one or more transparent layers of a material chosen for example from silica, titanium oxide, magnesium fluoride, as for the coloured coating, or any other dielectric material known for its anti-reflection properties.

The coloured coating may in essence be the same as the anti-reflection coating but designed differently. It uses the same materials, with a different stacking sequence and different thicknesses. However, the coloured coating may in addition use materials coloured by nature, for example having impurities such as rare earths, nanoparticles or phosphors.

A front protection device 31 can be disposed on the front face of the light concentration device, and this can be done by adhesive bonding. This front protection device 31 may be a glass plate or a plate of plastics material such as polymethyl methacrylate. FIG. 9D is referred to. The plate 1 and/or the diffraction grating 2 can then be produced from plastics material. A metal frame 34 can encircle the whole.

Figure 10A:
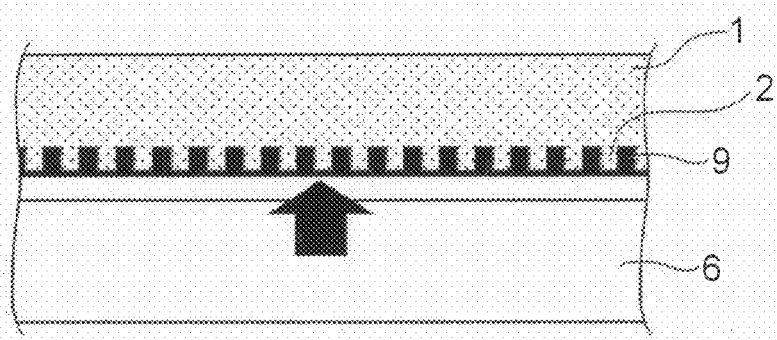
FIGS. 10A to 10C show steps of the method of producing the light concentration device with double refractive index gradient.

When the light concentration device is a sandwich with two plates 1, 6 and the diffraction grating 2 is inserted between them, it is possible for the second plate 6 to be attached to the diffraction grating 2 after the latter has been associated with the first plate 1 as illustrated in FIG. 10A. The diffraction grating 2 will have been able to be printed in relief on the first plate 1 on the same side as its highest refractive index.

Figure 10B:
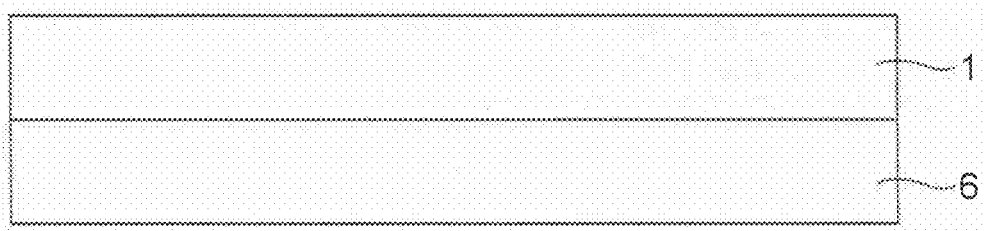

In this case, the spaces 5 between the patterns 3 of the diffraction grating 2 are filled with a filling material 9 having a refractive index contrast with that of the patterns 3 of the diffraction grating 2. This material may be a dielectric material (silica, silicon nitride or other) or a polymer or an organic/inorganic hybrid material and have a refractive index lower than that of the patterns. This material may project beyond the trenches but this is not a necessity. Another embodiment may also be envisaged. The two plates 1, 6 may be assembled together through their face having the highest refractive index (FIG. 10B), for example by adhesive bonding or molecular adhesion without glue. Next a fusion step is provided in order to make the interface disappear. These two plates 1, 6 may be monolithic or a stack of strips with different refractive indices as explained above. In the latter case, the strips can be placed, according to their refractive index, symmetrically with respect to the interface. Then a light guide is obtained, each of the plates 1, 6 forming a half light guide.

Figure 10C:
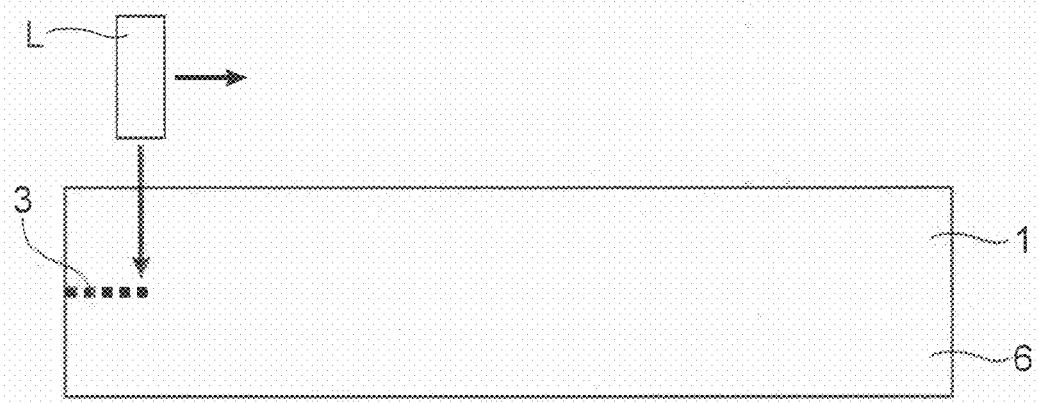

The diffraction grating can be formed by damage or refusion at the centre of the assembly, for example by a laser 1 focussed at the centre of the guide (FIG. 10C).

Although several embodiments of the present invention have been shown and described in detail, it will be understood that various changes and modifications can be made without departing from the scope of the invention.

The invention claimed is:

1. A light concentration device, comprising:
    a plate including two principal faces defining a thickness of the plate and an edge between the two principal faces, a refractive index gradient existing along the thickness of the plate; and
    a diffraction grating functioning in reflection or semi-reflection that cooperates with one of the principal faces of the plate having a highest refractive index, the principal face having a lowest refractive index forming a front entry face for the light, at least one exit zone for the light being disposed on the edge.

2. A light concentration device according to claim 1, in which the diffraction grating comprises unidimensional or bidimensional patterns.

3. A light concentration device according to claim 2, in which the unidimensional patterns are substantially parallel lines.

4. A light concentration device according to claim 3, in which the parallel lines are moldings with a triangular, quadrangular, trapezoidal, or rounded profile.

5. A light concentration device according to claim 2, in which the bidimensional patterns are cylindrically or conically shaped studs.

6. A light concentration device according to claim 2, in which the unidimensional patterns have a direction that is parallel to an edge of the principal face of the plate, the bidimensional patterns having an axis of symmetry that is parallel to an edge of a principal face of the plate.

7. A light concentration device according to claim 2, in which the unidimensional patterns have a direction that has an angle different from 0 and $\pi/2$ with respect to an edge of a principal face of the plate, the bidimensional patterns having an axis of symmetry that has an angle different from 0 and $\pi/2$ with respect of the principal face of the plate, or an angle equaling approximately arctan.

8. A light concentration device according to claim 2, in which the patterns of the diffraction grating have a substantially constant refractive index, greater than or equal to the highest refractive index of the plate.

9. A light concentration device according to claim 2, in which the patterns of the diffraction grating have a refractive index gradient between a principal face that cooperates with the plate and another principal face opposite to the one that cooperates with the plate.

10. A light concentration device according to claim 1, in which the diffraction grating comprises plural diffraction sub-gratings having patterns with different orientations.

11. A light concentration device according to claim 1, in which another plate with an index gradient, including two principal faces and an edge, and the plate with an index gradient form a sandwich in which the diffraction grating is situated, the diffraction grating being on the same side as the principal face having the highest refractive index of the another plate, the edge of the another plate including at least one light exit zone.

12. A light concentration device according to claim 1, in which the diffraction grating and the plate are produced from glass or a plastics material allowing light to pass or a polymer chosen from polystyrene, polymethyl methacrylate, or polycarbonate.

13. A light concentration device according to claim 12, in which the plastics material is loaded with nanoparticles based on silicon, titanium oxide, lead sulphide or an II-VI or III-V alloy for increasing its refractive index.

14. A light concentration device according to claim 1, in which the diffraction grating and the plate are flexible.

15. A photovoltaic device comprising a light concentration device according to claim 1 and a photovoltaic cell mounted on each exit zone.

16. A photovoltaic device according to claim 15, in which the photovoltaic cell includes a useful zone having dimensions that are substantially those of the exit zone on which it is mounted.

17. A light concentration device according to claim 1, in which the refractive index increases from the principal face that forms the front entry face to the principal face that cooperates with the diffraction grating.

18. A method of producing a light concentration device, said method comprising:
    obtaining a plate including two principal faces defining a thickness of the plate and an edge and having a refractive index increasing along the thickness of the plate, and
    situating a diffraction grating, functioning in reflection or semi-reflection, to cooperate with one of the principal faces of the plate having the highest refractive index,
    wherein at least one exit zone for the light is defined on the edge of the plate.

19. A method of producing a photovoltaic device, said method comprising:
    producing the light concentration device by the method according to claim 18, and
    mounting a photovoltaic cell facing each exit zone for light of the light concentration device.

* * * * *